United States Patent
Ichige et al.

(10) Patent No.: US 10,037,894 B2
(45) Date of Patent: Jul. 31, 2018

(54) POLISHING LIQUID FOR METAL AND POLISHING METHOD

(71) Applicant: Hitachi Chemical Company, Ltd., Chiyoda-ku, Tokyo (JP)

(72) Inventors: Yasuhiro Ichige, Ibaraki (JP); Kouji Haga, Ibaraki (JP); Seiichi Kondo, Ibaraki (JP)

(73) Assignee: HITACHI CHEMICAL COMPANY, LTD., Tokyo (JP)

(*) Notice: Subject to any disclaimer, the term of this patent is extended or adjusted under 35 U.S.C. 154(b) by 0 days.

(21) Appl. No.: 14/376,382

(22) PCT Filed: Jan. 29, 2013

(86) PCT No.: PCT/JP2013/051877
§ 371 (c)(1),
(2) Date: Aug. 1, 2014

(87) PCT Pub. No.: WO2013/115172
PCT Pub. Date: Aug. 8, 2013

(65) Prior Publication Data
US 2014/0370707 A1 Dec. 18, 2014

(30) Foreign Application Priority Data
Feb. 1, 2012 (JP) .................... 2012-019571

(51) Int. Cl.
*H01L 21/302* (2006.01)
*H01L 21/461* (2006.01)
(Continued)

(52) U.S. Cl.
CPC ........ *H01L 21/3212* (2013.01); *B24B 37/044* (2013.01); *C09G 1/00* (2013.01);
(Continued)

(58) Field of Classification Search
None
See application file for complete search history.

(56) References Cited

U.S. PATENT DOCUMENTS

| 2002/0062600 A1* | 5/2002 | Mandigo | C09K 3/1463 51/293 |
| 2006/0042502 A1* | 3/2006 | Sato | C09G 1/02 106/10 |
| 2009/0087989 A1 | 4/2009 | Kamimura | |

FOREIGN PATENT DOCUMENTS

| JP | 2004-153086 A | 5/2004 |
| JP | 2007-073548 | 2/2007 |

(Continued)

OTHER PUBLICATIONS

CN Office Action of Appln. No. 201380007749.2 dated Mar. 3, 2015 with English translation.

(Continued)

*Primary Examiner* — Stephanie P Duclair
(74) *Attorney, Agent, or Firm* — Fitch, Even, Tabin & Flannery, LLP

(57) ABSTRACT

The present invention relates to a metal polishing liquid for polishing at least a part of metal in a substrate having the metal, comprising, component A: a metal solubilizer containing amino acids, component B: compounds having the benzotriazole skeleton, and component C: an acrylic acid polymer having the weight average molecular weight of 10,000 or more, and having the mass ratio between the component B and the component C, (component B:component C), to be 1:1 to 1:5. Use of the metal polishing liquid can simultaneously yield high polishing rates and low etching rates at higher level, enabling to form an embedded pattern with higher reliability.

18 Claims, 1 Drawing Sheet

(51) Int. Cl.
  *C09K 13/00* (2006.01)
  *C03C 15/00* (2006.01)
  *C03C 25/68* (2006.01)
  *H01L 21/321* (2006.01)
  *C23F 1/00* (2006.01)
  *C09G 1/00* (2006.01)
  *C23F 1/14* (2006.01)
  *B24B 37/04* (2012.01)
  *C09K 3/14* (2006.01)
  *C09G 1/02* (2006.01)

(52) U.S. Cl.
  CPC .............. *C09G 1/02* (2013.01); *C09K 3/1409* (2013.01); *C09K 3/1463* (2013.01); *C09K 3/1472* (2013.01); *C23F 1/00* (2013.01); *C23F 1/14* (2013.01)

(56) References Cited

FOREIGN PATENT DOCUMENTS

| | | | | |
|---|---|---|---|---|
| JP | 2007-073548 | A | 3/2007 | |
| JP | 2007-142377 | A | 6/2007 | |
| JP | 2007-150263 | A | 6/2007 | |
| JP | 2007-150264 | * | 6/2007 | ........... H01L 21/304 |
| JP | 2007-150264 | A | 6/2007 | |
| JP | 2009-088243 | A | 4/2009 | |
| JP | 2009-514219 | A | 4/2009 | |
| JP | 2010-251492 | A | 11/2010 | |
| JP | 2010-538457 | A | 12/2010 | |
| WO | WO 00/13217 | A1 | 3/2000 | |
| WO | 2007/026863 | A1 | 3/2007 | |
| WO | WO 2008/108301 | A1 | 9/2008 | |

OTHER PUBLICATIONS

Office Action dated Jun. 14, 2016, by the Japan Patent Office in regards to counterpart Japanese Patent Application No. 2013-556408.

Office Action dated Jun. 6, 2016, by the Taiwan Intellectual Property Office in regards to corresponding Taiwan Patent Application 102103542.

Official Action Taiwanese application 102103542 dated Feb. 14, 2017 with Engiish translation thereof.

Office Action dated Sep. 6, 2016, by the Japan Patent Office in regards to Japanese Patent Application No. 2013-556408.

Office Action of counterpart JP Appln. No. 2013-556408 dated Feb. 28, 2017 with English translation.

Office Action of counterpart JP Appln. No. 2016-236606 Oct. 17, 2017 with English translation.

* cited by examiner

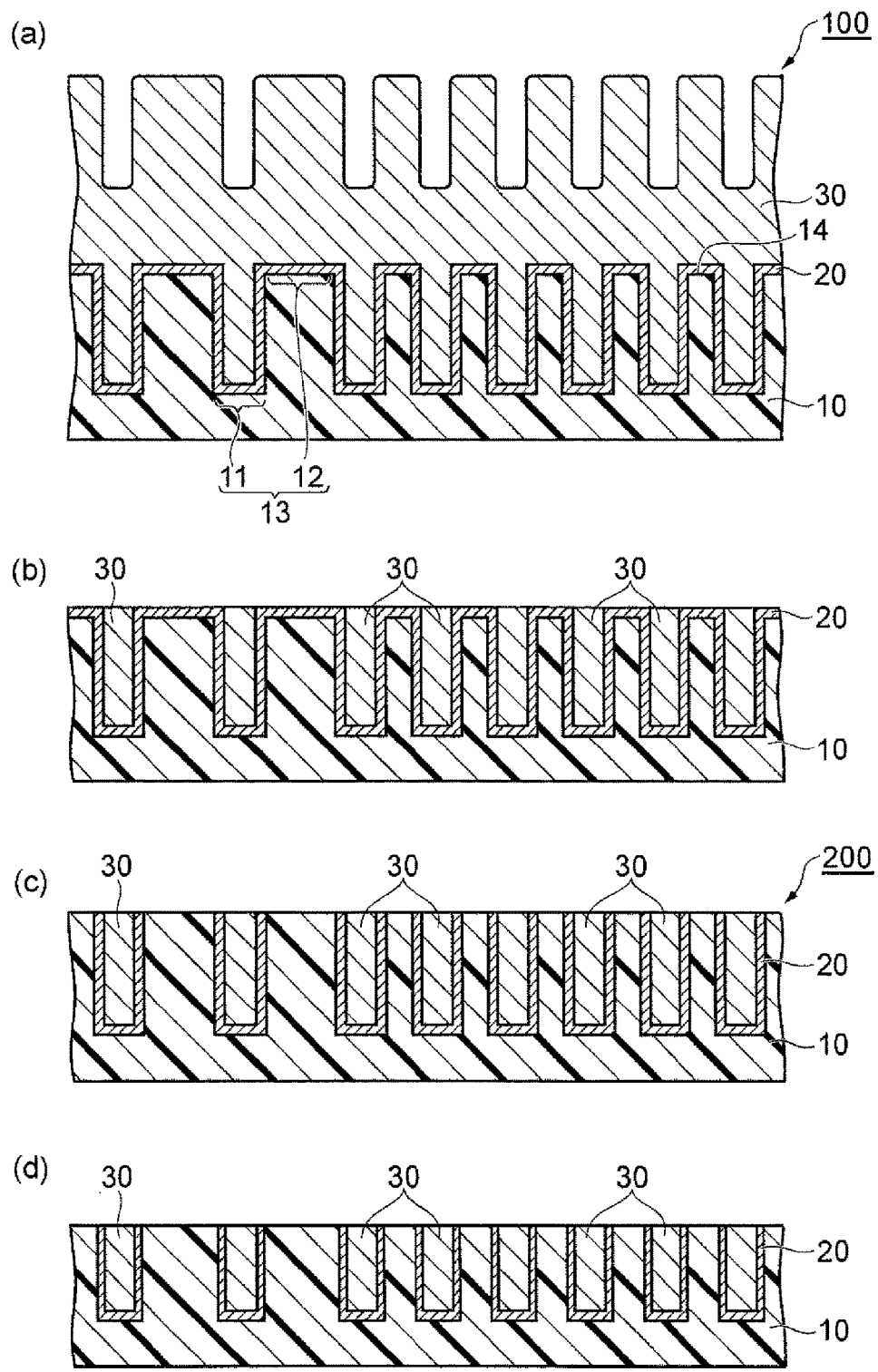

POLISHING LIQUID FOR METAL AND POLISHING METHOD

TECHNICAL FIELD

The present invention relates to a composition of a polishing liquid for metal that is used in chemical mechanical polishing and to a polishing method.

BACKGROUND ART

In recent years, new microfabrication technologies have been developed along with enhancement of integration and higher performance of a large scale integrated circuit (hereinafter, referred to as "LSI"). A chemical mechanical polishing (hereinafter, referred to as "CMP") is one of new microfabrication technologies and is frequently used in a manufacturing process of LSI. In particular, CMP is used in surface flattening of an insulating body in a step of forming a multilayer wiring structure, formation of a metal plug, and formation of an embedded pattern (embedded metal wiring).

In addition, in recent years, to achieve higher performance of LSI, use of copper, copper alloys, copper oxides, and oxides of copper alloys (hereinafter, collectively referred to as "copper type metal") is tried as a wiring material. However, the copper type metal is difficult to be microfabricated with a dry etching method, which is, in the past, frequently used in formation of aluminum alloy wiring. Then, so-called the Damascene process is mainly used of which the copper type metal is deposited for embedding into trench portions formed in advance on an insulating body and the copper type metal in the area other than the trench portions is then removed by CMP to form an embedded pattern.

A general CMP process for metal is a process in which a polishing pad is attached to a circular polishing wheel (platen) and the surface of the polishing pad is soaked with a metal polishing liquid followed by pressing the surface of metal formed on a substrate under the given pressure (hereinafter, referred to as "polishing pressure") from the backside of the substrate to the polishing pad while rotating the polishing wheel, thereby removing the metal in the convex parts by mechanical friction between the polishing liquid and the convex parts of the metal.

A metal polishing liquid used in CMP generally contains an oxidizing agent and solid abrasive grains. It is presumed that addition of a metal-dissolving component (metal solubilizer, metal oxide solubilizer, etching agent, and the like) is effective to increase a polishing rate in CMP. However, when the oxide layer of the metal surface in the concave parts is also dissolved (hereinafter, referred to as "etching") and the metal surface is exposed, the metal surface is further oxidized by oxidizing agent. Repetition of this process causes further etching of the metal in the concave parts, thereby causing potential reduction of the planarization effects. To prevent the progress of etching, a protective film-forming agent is further added.

Such addition of the metal solubilizer and the protective film-forming agent promotes the effects of chemical reaction for increasing the polishing velocity in CMP (hereinafter, sometimes referred to as a "polishing rate") as well as for reducing a damage of the metal surface subjected to CMP. At present, in addition to the metal solubilizer and the protective film-forming agent, use of various substances such as a polymer electrolyte, phosphonic acid, and the like is evaluated as an additive, leading to yield a relatively high polishing rate and a low etching rate. These technologies are disclosed, for example, in Patent Literatures 1 and 2.

As a polishing liquid for polishing copper type metal, a metal solubilizer containing an oxidizing agent, a metal dissolving agent, a first protective film-forming agent, a second film-forming agent different from the first protective film-forming agent, and water is known, in which the first protective film-forming agent described above is a compound to form a protective film on the metal surface by physical absorption and/or chemical bonding and the second protective film-forming agent described above is a compound to assist the first protective film-forming agent to form the protective film (refer to Patent Literature 3). More specifically, a metal polishing liquid is disclosed of which the first protective film-forming agent described above is at least one type selected from benzotriazole and its derivatives and the second protective film-forming agent described above is at least one type selected from polyacrylic acid, polymethacrylic acid, polyamic acid, ammonium polyacrylate, ammonium polymethacrylate, ammonium polyamate, and polyacrylamide. It is presumed that such a metal polishing liquid can polish the copper type metal at good polishing rates while preventing the copper type metal from etching.

In addition, as a similar polishing liquid, a metal polishing liquid containing a metal solubilizer, a metal corrosion inhibitor (protective film-forming agent), polyacrylic acid type polymer, and water, to which a large amount (12 to 30% by mass) of hydrogen peroxide is added relative to the mass of the metal polishing liquid is known (refer to Patent Literature 4). It is presumed that use of such a polishing liquid can generate good polishing rates for a copper type metal even with a low polishing pressure so that a polished surface excellent in flatness can be obtained.

CITATION LIST

Patent Literatures

Patent Literature 1: JP 2010-538457 W
Patent Literature 2: JP 2009-514219 W
Patent Literature 3: WO 00/13217
Patent Literature 4: WO 08/108,301

SUMMARY OF INVENTION

Problem to be Solved by Invention

However, in recent years, it is requested that both high polishing rates and low etching rates are simultaneously obtained at higher level, enabling to form an embedded pattern with higher reliability, but conventional polishing liquids cannot fully respond to those requirements. In view of the problem described above, the present invention has a purpose to provide a metal polishing liquid with which both high polishing rates and low etching rates against metal (in particular, copper type metal) are simultaneously obtained at higher level, enabling to form an embedded pattern with higher reliability.

Means for Solving Problems

A specific embodiment of the present invention relates to the following.

A metal polishing liquid for polishing a part of metal in a substrate having the metal, comprising
component A: a metal solubilizer containing an amino acid, component B: a compound having the benzotriazole skeleton, and
component C: an acrylic acid polymer having the weight average molecular weight of 10,000 or more,
wherein the mass ratio between the component B and the component C, (component B:component C), is 1:1 to 1:5.

Such metal polishing liquid simultaneously yields both high polishing rates and low etching rates against metal (in particular, copper type metal) at higher level, and can provide that enabling to form an embedded pattern with higher reliability.

In addition, the present invention relates to the metal polishing liquid of which pH is within a range of 2 to 6. Such metal polishing liquid gives further excellent polishing rates against the copper type metal, providing a good balance between polishing rates and etching rates.

In addition, the present invention further relates to the metal polishing liquid further comprising abrasive grains. Such metal polishing liquid enables to polish metal (in particular, copper type metal) at further higher polishing rates.

In addition, the present invention relates to the metal polishing liquid, comprising at least one type selected from the group consisting of copper type metal, that is, the group consisting of copper, copper alloys, copper oxides, and oxides of copper alloys, as metal to be polished. An excellent balance between polishing rates and etching rates can be provided by use of such metal polishing liquid.

In addition, the present invention relates to a method of polishing a part of metal in a substrate having the metal, wherein the polishing is performed by using the metal polishing liquid described above. Such polishing method enables to polish the substrate having metal (in particular, copper type metal) at high polishing rates and to embed a pattern with higher reliability because of low etching rates.

Disclosure of the present application relates to the main subject described in Japanese Patent Application No. 2012-019571 applied on Feb. 1, 2012 and the disclosure is expressly incorporated herein by reference.

Advantageous Effects of Invention

A metal polishing liquid of the present invention can simultaneously yields both high polishing rates and low etching rates at higher level, thus enabling to form an embedded pattern with higher reliability.

BRIEF DESCRIPTION OF DRAWINGS

FIGS. 1(a) to 1(d) illustrate schematic sectional views for describing a polishing method of a substrate in accordance with an embodiment of the present invention.

MODES FOR CARRYING OUT THE INVENTION

A metal polishing liquid in an embodiment of the present invention is a metal polishing liquid for polishing at least a part of metal in a substrate having the metal, which contains a metal solubilizer containing an amino acid (component A), a compound having the benzotriazole skeleton (component B), and an acrylic acid polymer having the weight average molecular weight of 10,000 or more (component C), in which the mass ratio between the component B and the component C, (component B:component C) is 1:1 to 1:5. Hereinafter, each component contained in the metal polishing liquid and other components which can be arbitrarily added will be described in order.

(Component A: Metal Solubilizer Containing an Amino Acid)

A metal polishing liquid of the embodiment contains a metal solubilizer which contains an amino acid (component A). The metal solubilizer herein is a component which has capability to form a chelate with metal (in particular, copper type metal) to accelerate elution rates and polishing rates.

Amino acids described above include glycine, α-alanine, β-alanine, 2-aminobutyric acid, norvaline, valine, leucine, norleucine, isoleucine, alloisoleucine, phenylalanine, proline, sarcosine, ornithine, lysine, taurine, serine, threonine, allothreonine, homoserine, tyrosine, 3,5-diiodotyrosine, β-(3,4-dihydroxyphenyl)alanine, thyroxin, 4-hydroxy-proline, cysteine, methionine, ethionine, lanthionine, cystathionine, cysteine, cysteic acid, aspartic acid, glutamic acid, S-(carboxymethyl)cysteine, 4-aminobutyric acid, asparagine, glutamine, azaserine, arginine, canavanine, citrulline, δ-hydroxy-lysine, creatine, kynurenine, histidine, 1-methyl-hystidine, 3-methyl-hystidine, ergothioneine, tryptophan, and the like.

Among them, low molecular weight amino acids are preferred, from the viewpoint of simultaneously yielding both high polishing rates and low etching rates. Specifically, amino acids with the molecular weight of 200 or less are preferred, and amino acids with the molecular weight of 150 or less are more preferred. In addition, primary amino acids having a primary amino group ($-NH_2$) are preferred.

Among them, primary amino acids with the molecular weight of 200 or less are preferred, and specifically include glycine, alanine, β-alanine (3-aminopropanoic acid), 4-aminobutyric acid, and the like.

A blend amount of a metal solubilizer in the present invention is preferably 0.001 parts by mass or more relative to 100 parts total by mass of polishing liquid, from the viewpoint of enabling to completely dissolve the metal, more preferably 0.01 parts by mass or more, further preferably 0.1 parts by mass or more, particularly preferably 0.3 parts by mass or more, highly preferably 0.5 parts by mass or more, and extremely preferably 0.7 parts by mass or more. Such a blend amount is preferably 10 parts by mass or less relative to 100 parts total by mass of the polishing liquid, from the viewpoint of making easy prevention of etching, more preferably 5 parts by mass or less, further preferably 3 parts by mass or less, particularly preferably 2 parts by mass or less, and extremely preferably 1.5 parts by mass or less.

In addition, a metal solubilizer other than amino acids can be contained in order to increase polishing rates. Metal solubilizers other than amino acids include compounds of inorganic acids, compounds of organic acids (but excluding amino acids), and the like. However, from the viewpoint of simultaneously yielding both high polishing rates and low etching rates against the copper type metal, the mole ratio of amino acids in the metal solubilizer is preferably 90 mol % or more, more preferably 95 mol % or more, further preferably 97 mol % or more, particularly preferably 99 mol % or more, very preferably 99.9 mol % or more, extremely preferably 100 mol % (as a metal solubilizer, only amino acids are contained but no compounds of inorganic acids and compounds of organic acids described above). Incidentally, when an acid is added as a pH adjusting agent as described below, the added amount is included as an amount of the metal solubilizer added.

Compounds of inorganic acids described above include inorganic acids such as hydrochloric acid, sulfuric acid, nitric acid, phosphoric acid, chromic acid, and the like and salts of those inorganic acids.

Compounds of organic acids described above include organic acids such as formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, diglycolic acid, salicylic acid, glyceric acid, oxalic acid, malonic acid, succinic acid, glutaric acid, gluconic acid, adipic acid, pimelic acid, maleic acid, fumaric acid, phthalic acid, malic acid, tartaric acid, citric acid, and the like, esters of those organic acids, ammonium salts of organic acids described above, and the like.

(Component B: Compound Having the Benzotriazole Skeleton)

A metal polishing liquid in the embodiment of the present invention contains a compound having the benzotriazole skeleton (component B). It is considered that a compound having the benzotriazole skeleton forms a protective film on the surface of metal (in particular, copper type metal) to realize corrosion inhibition. While the mechanism for corrosion inhibition is not limited by this description, in the present specification such compounds are expediently called a "protective film-forming agent". In addition, it is considered that compounds having the benzotriazole skeleton have a function in which these compounds orient themselves with the hydrophobic structure directed to the side contacting to the polishing pad, thereby enhancing friction to the polishing pad to increase polishing rates. Incidentally, when compounds having the benzotriazole skeleton have an acid group (for example, carboxylic acid), the blend amount is not counted based on the compound of an organic acid described above, but on the compound having the benzotriazole skeleton.

Compounds having the benzotriazole skeleton include benzotriazole, 1-hydroxybenzotriazole, 5-nitro-(1H)-benzotriazole, 5-chloro-(1H)-benzotriazole, 1-methyl-(1H)-benzotriazole, 1-ethyl-(1H)-benzotriazole, methyl 1H-benzotriazole-5-carboxylate, 6-bromo-(1H)-benzotriazole, 1H-benzotriazole-5-carboxylic acid, 2-amino-2H-benzotriazole, 1H-benzotriazole-1-amine, 1-acetyl-1H-benzotriazole, 1-amino-7-methyl-1H-benzotriazole, 1-amino-5-methyl-1H-benzotriazole, 5-methoxy-1H-benzotriazole, 1-chloro-1H-benzotriazole, 1-vinyl-1H-benzotriazole, 4-amino-1-methyl-1H-benzotriazole, 1-methyl-1H-benzotriazole-5-amine, 1-methyl-1H-benzotriazole-5-amine, 2-methyl-2H-benzotriazole, 2H-benzotriazole, 5,6-dimethyl-1H-benzotriazole, 4,7-dimethyl-1H-benzotriazole, 1-dihydroxypropylbenzotriazole, 2,3-dicarboxypropylbenzotrizole, 4-hydroxybenzotriazole, 4-carboxyl-(1H)-benzotriazole, methyl (1H)-benzotriazole-4-carboxylate, butyl (1H)-benzotriazole-4-carboxylate, octyl (1H)-benzotriazole-4-carboxylate, 5-hexylbenzotriazole, 5-methyl-(1H)-benzotriazole (tolyltriazole), naphthotriazole, and the like.

Among them, benzotriazole, 1-hydroxybenzotriazole, and 5-methyl-(1H)-benzotriazole are preferred, from the viewpoint of simultaneously yielding both high polishing rates and low etching rates against copper type metal.

In addition, in addition to compounds having the benzotriazole skeleton well known protective film-forming agents having function of corrosion inhibition against metal can be contained. Such compounds can include, for example, azoles (excluding compounds having the benzotriazole skeleton) such as thiazoles, imidazoles, pyrazoles, and the like, pyrimidines, guanidines, quinaldines, salicylaldoxime, and the like.

A blend amount of component B (compounds having the benzotriazole skeleton) in a metal polishing liquid of the embodiment of the present invention is preferably 0.0001 parts by mass or more relative to 100 parts total by mass of polishing liquid, from the viewpoint of preventing etching, more preferably 0.001 parts by mass or more, further preferably 0.005 parts by mass or more, particularly preferably 0.01 parts by mass or more. In addition, such a blend amount is preferably 0.5 parts by mass or less relative to 100 parts total by mass of polishing liquid, from the viewpoint of achieving sufficient polishing rates against metal, more preferably 0.2 parts by mass or less, further preferably 0.1 parts by mass or less, particularly preferably 0.05 parts by mass or less.

In addition, when a protective film-forming agent other than compounds having the benzotriazole skeleton is contained, the total content of both compounds (total content of both protective film-forming agents) preferably meets the range described above.

(Component C: Acrylic Acid Polymers with the Weight Average Molecular Weight of 10,000 or More)

A metal polishing liquid in the embodiment of the present invention contains an acrylic acid polymer having the weight average molecular weight of 10,000 or more (component C). It is considered that the acrylic acid polymer having the weight average molecular weight of 10,000 or more is absorbed on the surface of metal (in particular, copper type metal) making its surface hydrophilic. This makes easier the polishing liquid component approach to the vicinity of metal, thereby enhancing the action to increase polishing rates.

Acrylic acid polymers are herein defined as a polymer which is obtained by polymerizing a monomer component containing compounds having the acrylic acid skeleton ($C=C-C(=O)-$ skeleton). Acrylic acid polymers described above may be a single-type polymer (homopolymer) obtained by polymerizing a monomer component consisted of a single type of monomers or a copolymerized polymer (copolymer) obtained by polymerizing a monomer component consisted of two types or more of monomers. Among them, a homopolymer is preferred, from the viewpoint of increasing the hydrophilicity of the surface of metal (in particular, copper type metal). One type of an acrylic acid polymer can be used alone, or two types of more of acrylic acid polymers can be used in combination.

Compounds having the acrylic acid skeleton described above include acrylic acid, meth acrylic acid, crotonic acid, vinylacetic acid, tiglic acid, 2-trifluoromethylacrylic acid, itaconic acid, fumaric acid, maleic acid, citraconic acid, mesaconic acid, gluconic acid, and the like, as a compound having the skeleton of $C=C-C(=O)-OH$ (that is, compounds having the skeleton of $C=C-COOH$).

Acrylic acid polymers described above may be in the structure of $C=C-C(=O)-O^-X^+$ (that is, structure of $C=C-COO^-X^+$) of which at least a part of the carboxylic acid group forms a salt. Salts described above include ammonium salts, alkali metal salts, alkylamine salts, and the like. In the embodiment of the present invention, salts of acrylic acid polymers are defined as a polymer in which at least a part of the salt-formable carboxylic acid group forms a salt. For example, a polymer of which at least a part of carboxylic acid groups in polyacrylic acid (homopolymer of acrylic acid) is substituted with a base of ammonium carboxylate is called "ammonium salt of polyacrylic acid".

In addition, compounds having the acrylic acid skeleton described above may be a compound having the skeleton of C=C—C(=O)—R (that is, compounds having the skeleton of C=C—COR, while R indicates an organic group), and specifically include alkyl esters of compounds exemplified as the compound having the C=C—COOH skeleton described above, acrylamide compounds (C=C—CONR$_2$ while R is hydrogen or an alkyl group), acrylic acid hydrazide compounds (C=C—CONH—NR$_2$, while R indicates hydrogen or an alkyl group), and the like. For example, methyl acrylate, butyl acrylate, methyl methacrylate, butyl methacrylate, acrylamide, acrylic acid hydrazide can be included.

Acrylic acid polymers described above are preferably polymers which are obtained by polymerizing a monomer component containing at least any one of acrylic acid, acrylamide, and acrylic acid hydrazide.

As described above, specific acrylic acid polymers are preferably polyacrylic acid, polyacrylamide, aminopolyacrylamide, an ammonium salt of polyacrylic acid, and a sodium salt of polyacrylic acid, and among them, polyacrylic acid (homopolymer of acrylic acid) and an ammonium salt of polyacrylic acid are preferred, from the viewpoint of simultaneously yielding both polishing rates and low etching rates against metal.

In the embodiment of the present invention, the weight average molecular weight of acrylic acid polymers described above is 10,000 or more, from the viewpoint of high polishing rates against metal. From similar viewpoint, the weight average molecular weight described above is preferably 20,000 or more, more preferably 30,000 or more. While the upper limit of the weight average molecular weight is not particularly defined, it is preferably 5,000,000 or less, from the viewpoint of solubility. The weight average molecular weight is preferably somewhat low, from the viewpoint of simultaneously yielding both high polishing rates and low etching rates against metal. Specifically, the weight average molecular weight is preferably 1,000,000 or less, more preferably 500,000 or less. As a polishing rate against metal is more prioritized, the weight average molecular weight of 100,000 or less is extremely preferred.

The weight average molecular weight described above can be determined, for example, using GPC (gel permeation chromatography) under the following condition.
(Measurement Condition for GPC)
Sample: 10 μL (L indicates liter. The same is applied hereinafter)
Standard polystyrene: Standard polystyrene kits made by TOSOH Co., Ltd. (molecular weight: 190,000; 17,900; 9,100; 2,980; 578; 474; 370; and 266)
Detector: Refractive index (RI) detector with the trade name of "L-3000" made by Hitachi, Ltd.
Integrator: GPC integrator with the trade name of "D-2200" made by Hitachi, Ltd.
Pump: Pump with the trade name of "L-6000" made by Hitachi, Ltd.
Degassing device: Degassing device with the trade name of "Shodex DEGAS" made by Showa Denko Co., Ltd.
Column: Columns with the trade name of Gelpack "GL-R440", "GL-R430", and "GL-R420" made by Hitachi Chemical Co., Ltd, which are connected in this order when used.
Eluent: Tetrahydrofuran (THF)
Measurement temperature: 23° C.
Flow rate: 1.75 mL/min
Measurement time: 45 minutes A blend amount of an acrylic acid polymer having the weight average molecular weight of 10,000 or more is preferably 0.0005 parts by mass relative to 100 parts total by mass of polishing liquid, from the viewpoint of demonstrating synergistic effects with component B in prevention of etching, more preferably 0.005 parts by mass or more, further preferably 0.01 parts by mass or more, particularly preferably 0.02 parts by mass or more. In addition, the upper limit of a blend amount is preferably 2.5 parts by mass or less relative to 100 parts total by mass of polishing liquid, from the viewpoint of keeping polishing rates against metal at optimum level, more preferably 1 part by mass or less, further preferably 0.5 parts by mass or less, particularly preferably 0.1 parts by mass or less.

(Mass Ratio Between Component B and Component C)

In the metal polishing liquid of the embodiment in the present invention it is important to produce a proper balance between the content of component B (compounds having the benzotriazole skeleton) and the content of component C (acrylic acid polymer having the weight average molecular weight of 10,000 or more), from the viewpoint of simultaneously yielding both sufficient polishing rates and effective reduction of etching rates against metal. Specifically, in a metal polishing liquid of the embodiment in the present invention it is required to adjust the mass ratio of component B to component C, (component B:component C), to be 1:1 to 1:5.

The reasons why such a mass ratio produces a good balance between high polishing rates and low etching rates are not clear yet, but the present inventors consider the reason as follows. That is, component B (compound having the benzotriazole skeleton) and component C (acrylic acid polymer having the weight average molecular weight of 10,000 or more) which were absorbed to the surface of metal (in particular, copper type metal) produce friction of the surface of metal (in particular, copper type metal) to a polishing pad optimum, thereby making the metal surface hydrophilic. It is considered that this makes supply of the metal polishing liquid to the surface of metal (in particular, copper type metal) easier, thereby dissolving the metal (in particular, copper type metal) at higher rates to enable polishing of the metal.

As described above, while the mass ratio between the component B and the component C, (component B:component C), is 1:1 to 1:5, the ratio described above is preferably 1:1 to 1:4, from the viewpoint of simultaneously yielding both sufficient polishing rates and effective reduction of etching rates against metal, further preferably 1:2 to 1:4, particularly preferably 1:2 to 1:3. As the mass ratio is 1:1 or more, there is a tendency to suppress etching rates and generate sufficient polishing rates. As the mass ratio is 1:5 or less, there is a tendency to generate high polishing rates. In addition, when a protective film-forming agent other than the component B described above is contained as a protective film-forming agent, it is preferred to meet the mass ratio between the component B and the component C described above as well as to meet the ratio between the total content of both components and component C to be within the range described above.

(pH)

In a metal polishing liquid of the embodiment in the present invention pH is preferably adjusted to 2 or higher, from the viewpoint of making suppression of etching easier. From a similar viewpoint, pH is more preferably 3 or higher, further preferably 4 or higher. In addition, pH is preferably 6 or less, from the viewpoint of generating sufficient polishing rates against metal, more preferably 5 or less. pH is preferably in a range of 2 to 6, from the viewpoint described above.

pH of a metal polishing liquid in the present invention may be adjusted by using an acid or a base as a pH adjusting agent. pH adjusting agents described above include inorganic acids such as sulfuric acid, hydrochloric acid, nitric acid, and the like and inorganic bases such as sodium hydroxide, potassium hydroxide, ammonia, and the like. Among them, sulfuric acid and ammonia are preferred because of easiness with pH adjustment.

(Oxidizing Agent)

A metal polishing liquid of the embodiment in the present invention may contain oxidizing agents. Addition of oxidizing agents tends to convert the surface of metal (in particular, copper type metal) to an oxidized form of metal which is more susceptible to polishing, thereby generating the positive effects to promote the polishing ability. Oxidizing agents described above include hydrogen peroxide ($H_2O_2$), potassium periodate, ozonated water, and the like. Among them, hydrogen peroxide is preferred, from the viewpoint of stability.

When a metal polishing liquid of the embodiment in the present invention contains oxidizing agents, its content is preferably 0.01 parts by mass or more against 100 parts total by mass of polishing liquid, from the viewpoint of completely oxidizing the metal making good polishing rates yield easier, more preferably 0.1 parts by mass or more, further preferably 0.5 parts by mass or more, particularly preferably 1.0 part by mass or more. On the one hand, the content of oxidizing agents described above is 10.0 parts by mass or less relative to 100 parts total by mass of polishing liquid, from the viewpoint of preventing the surface of polished metal from roughing, more preferably 7.0 parts by mass or less, further preferably 5.0 parts by mass or less, particularly preferably 3.0 parts by mass or less, highly preferably 2.0 parts by mass or less.

(Abrasive Grain)

A metal polishing liquid of the embodiment in the present invention can generate sufficient polishing rates without containing abrasive grains. However, the metal polishing liquid of the embodiment in the present invention can contain abrasive grains in order to increase polishing rates against metal and to balance polishing rates with suppression of etching.

Abrasive grains described above include inorganic abrasive grains such as silica, alumina, ceria, titania, zirconia, germania, silicon carbide, and the like, organic abrasive grains such as polystyrene, polyacrylate, polyvinyl chloride, and the like, and complex abrasive grains which is a combination of the inorganic abrasive grains described above with the organic abrasive grains described above. One type of such abrasive grains can be used singly or two types of them can be used in combination. Among them, silica and alumina are preferred, from the viewpoint of good stability in dispersion in the polishing liquid and generating less scratches on the metal surface in polishing, colloidal silica and colloidal alumina are more preferred, and colloidal silica is further preferred.

Abrasive grains described above preferably have an average grain size of secondary particle diameter to be 120 nm or less, from the viewpoint of the stability of dispersion. In addition, the average grain size described above is more preferably 100 nm or less, from the viewpoint of sufficient suppression of etching, further preferably 90 nm or less, particularly preferably 80 nm or less. The average grain size of secondary particle diameter described above is preferably 10 nm or more, from the viewpoint of generating sufficient polishing rates against metal, more preferably 30 nm or more, further preferably 50 nm or more, particularly preferably 60 nm or more. In this way, the average grain size of secondary particle diameter described above is preferably 10 to 120 nm, from the viewpoint of generating sufficient polishing rates against metal and effective suppression of etching.

In the present invention the average grain size can be determined using a dynamic light scattering particle size distribution analyzer (for example, the trade name of COULTER N5 made by COULTER Electronics, Inc.). Specifically, an optimum amount of a liquid suspension of abrasive grains (for example, colloidal silica as a raw material, metal polishing liquid, and the like) is weighed and diluted with water if needed to prepare a measurement sample to adjust the concentration at which the light intensity scattered by particles is measurable with the dynamic light scattering particle size distribution analyzer. Next, the measurement sample is placed on the dynamic light scattering particle size distribution analyzer which is operated in light scatter mode to assign the value of D50 obtained to the average grain size.

When abrasive grains are blended, the blend amount of abrasive grains is preferably 10.0 parts by mass or less relative to 100 parts total by mass of polishing liquid, from the viewpoint of keeping dispersion in the polishing liquid stable, more preferably 5.0 parts by mass or less, particularly preferably 1.0 part by mass or less, extremely preferably 0.5 parts by mass or less. In addition, the blend amount is more preferably 0.01 parts by mass relative to 100 parts total by mass of polishing liquid in order to generate the positive effects on increase of polishing rates with abrasive grains, particularly preferably 0.05 parts by mass or more.

(Polishing Method)

An appropriate embodiment for a polishing method of the present invention will be described next. A polishing method for a substrate having a metal in the present embodiment is characterized in that the polishing liquid described above is used to polish at least a part of metal on the substrate having the metal described above using the metal polishing liquid describe above. That is, it is an application of the metal polishing liquid described above for a polishing method for metal characterized in that at least a part of metal on the substrate having the metal described above is polished.

More specifically, a polishing method is a process to polish the substrate in which the metal polishing liquid described above is fed between the face of the substrate to be polished and a polishing pad while pressing the polishing face of the substrate onto the polishing pad on a polishing wheel, thereby causing relative movement (for example, by rotation) between the polishing pad and the substrate with each other.

A metal polishing liquid of the present invention is preferably used in so-called the Damascene method of which the copper type metal is deposited and embedded in trench portions formed in advance on an insulating body and the copper type metal in the area other than the trench portions is removed by CMP to form an embedded pattern. Hereinafter, the polishing method of the present invention will be described in detail using the drawings.

FIGS. 1(a) to 1(d) are schematic sectional views of illustrating the Damascene method. Firstly a substrate 100 illustrated in FIG. 1(a) is prepared. The substrate 100 is provided with an interlayer insulating material 10, a barrier metal 20, and a layer of conductive materials (metal layer) 30. The interlayer insulating material 10 described above has, on a surface of one side 14, a step difference portion 13 consisted of a trench portion 11 and a raised portion 12 adjacent to each other. The barrier metal 20 described above is provided such that it follows the surface of one side 14 having the step difference portion 13 to cover the interlayer insulating material 10. The layer of conductive materials 30 described above is provided such that it fills the trench portions 11 of the barrier metal 20 as well as it covers the barrier metal 20. Incidentally, in the process of forming wiring in the semiconductor device, the interlayer insulating material 10, the barrier metal 20, and the layer of the conductive materials 30 are generally formed on a substrate such as a silicon substrate and the like, but in FIGS. 1(a) to 1(d) the structure of lower layers in the interlayer insulating material 10 is omitted.

A polishing method of the substrate in accordance to the present embodiment is provided with a first step in which as illustrated in FIG. 1(b), the layer of conductive materials 30 on the substrate 100 is polished to expose the part located above the raised portions 12 in the barrier metal 20 and with a second step in which as illustrated in FIG. 1(c), at least the barrier metal 20 and the layer of the conductive materials 30 filled in the trench portions 11 are polished to expose the raised portions 12 of the interlayer insulating material 10. A polishing method of the substrate in accordance to the present embodiment may be provided with a step (over-polish step) of further polishing a part of the raised portions 12 of the interlayer insulating material 10 after the second step as illustrated in FIG. 1(d).

A metal polishing liquid of the present invention is preferably used in polishing of metal in the first step described above. The layer of conductive materials 30 contains as a main component metal such as copper (pure copper, copper alloys, copper oxides, oxides of copper alloys, and the like), tungsten (pure tungsten, tungsten alloys, and the like), silver, gold, and the like. Among them, the layer of conductive materials 30 preferably contains copper type metals as a main component.

In the second step a polishing liquid is not limited so far as the barrier metal 20 and the layer of conductive materials 30 can be polished, but it is preferred to use the metal polishing liquid described above obtained in the present embodiment. In a substrate 200 obtained through the steps described above the barrier metal 20 is formed along the surface of the inner wall of the trench portions 11 and the layer of conductive materials 30 is formed on the barrier metal 20 to fill the trench portions 11. In addition, in the substrate 200 the raised portions 12 in the interlayer insulating material 10 are exposed.

The interlayer insulating material 10 is preferably at least one type selected from silicon type films and organic polymer films. Silicon type films include silica type films such as silicon dioxide, fluorosilicate glass, organosilicate glass (silicate glass obtained from trimethylsilane, dimethoxydimethylsilane, and the like as a starting material), silicon oxynitride, hydrogenated silsesquioxane, and the like, and films of silicon carbide, silicon nitride, and the like. In addition, organic polymer films include, for example, fully aromatic type interlayer insulating materials with constant dielectric constant. A chemical vapor deposition (CVD) method, a spin coating method, a dip coating method, a spray coating method, and the like can be used for formation of the interlayer insulating material 10. In addition, photolithography and the like can be used for formation of the step difference part 13 in the interlayer insulating material 10.

The barrier metal 20 has function of preventing the metal from diffusing from the layer of conductive materials 30 into the interlayer insulating material 10 as well as increasing contact between the interlayer insulating material 10 and the layer of conductive materials 30. A constitution material of the barrier metal 20 is preferably at least one type selected from tantalum, tantalum alloys, tantalum compounds (for example, tantalum nitride), titanium, titanium alloys, titanium compounds (for example, titanium nitride), tungsten, tungsten alloys, tungsten compounds (for example, tungsten nitride), ruthenium, ruthenium alloys, and ruthenium compounds (for example, ruthenium nitride). Incidentally, FIGS. 1(a) to 1(d) illustrate an example in which the barrier metal 20 has a single layer structure, but the barrier metal 20 may have a multilayered structure with two layers or more.

A polishing device is preferably, for example, a device equipped with a holder for holding a substrate, a polishing wheel to which a polishing pad is attached, and a means for supplying a polishing liquid to the polishing pad. A polishing device includes, for example, a polishing device Model EPO-111 made by EBARA Corporation, a polishing device with the trade name of Mirra 3400, Reflextion, and Reflextion made by Applied Materials, Inc., and the like. Polishing pads are not particularly limited, and for example, general nonwoven fabrics, foamed polyurethane, porous fluoro resins, and the like can be used. In addition, the polishing pad is preferably machined to form grooves in which polishing liquid can be collected.

A polishing condition is not particularly limited, but a rotational speed of a polishing wheel is preferably 200 $min^{-1}$ or less, from the viewpoint of preventing a substrate from jumping out, and the pressure (applied load) applied to the substrate is preferably 100 kPa or less, from the viewpoint of preventing scratches from occurrence on the polishing surface. A polishing liquid is preferably continuously fed by a pump and the like to the polishing pad during polishing operation. The amount of the polishing liquid supplied is not limited, but it is preferred always to keep the surface of the polishing pad covered with the polishing liquid.

After completing the polishing process, it is preferred to wash the substrate thoroughly with running water and to fling off water droplets attached to the substrate with a spin drier and the like to dry. In this way polishing can reduce surface roughness to yield a smooth surface over the whole surface of the substrate. Processes for formation of film layers and its polishing are repeated in a given frequency to manufacture a substrate having a given number of layers.

The polishing liquid of the present invention can be used not only in polishing metals formed on the semiconductor substrate described above, but also in polishing the substrate for magnetic heads and the like.

EXAMPLES

Hereinafter, the present invention will be described in accordance with examples. The present invention is not limited to these examples.

Preparation of Metal Polishing Liquid

Example 1

To a 1-L plastic vessel, 80 parts by mass of purified water was charged followed by dissolving glycine (component A) to adjust the blend amount to the value described in Table 1. Incidentally, the blend amounts in Tables 1-3 are given in parts by mass.

Next, polyacrylic acid with the weight average molecular weight of 40,000 (component C) was dissolved to adjust the blend amount to the value described in Table 1.

Next, benzotriazole (component B) was dissolved to adjust the blend amount to the value described in Table 1.

Next, hydrogen peroxide (30% by mass/volume aqueous solution) was mixed to adjust the blend amount to the value described in Table 1.

Finally, an appropriate amount of purified water was added to the mixture to prepare 100 parts total by mass of the metal polishing liquid.

Example 2

To a 1-L plastic vessel, 80 parts by mass of purified water was charged followed by dissolving glycine (component A) to adjust the blend amount to the value described in Table 1.

Next, polyacrylic acid with the weight average molecular weight of 40,000 (component C) was dissolved to adjust the blend amount to the value described in Table 1.

Next, benzotriazole (component B) was dissolved to adjust the blend amount to the value described in Table 1.

Next, colloidal silica (content of silica particles: 20% by mass) with the average grain size of 70 nm was mixed to adjust the blend amount as the silica particles to the value described in Table 1.

Next, hydrogen peroxide (30% by mass/volume aqueous solution) was mixed to adjust the blend amount to the value described in Table 1.

Finally, an appropriate amount of purified water was added to the mixture to prepare 100 parts total by mass of the metal polishing liquid.

Examples 3-9 and Comparative Examples 1-12

100 parts by mass of metal polishing liquids were prepared similarly to Example 2 except each component contained in the final metal polishing liquid was changed to the added components and their blend amounts described in Tables 1-3.

The metal polishing liquids obtained as described above were evaluated in evaluation items indicated below. The results are shown in Tables 1-3.

(Evaluation Conditions for a Polishing Rate)
(1) Substrate: Silicon substrate on which a 1-μm thick copper layer is formed (blanket wafer).
(2) Polishing pressure: 21 kPa
(3) Relative velocity between a substrate and a polishing wheel: 36 m/min
(4) Feed rate of polishing liquid: 200 mL/min
(5) Polishing pad: Foamed polyurethane resin (IC-1010 made by Nitta Haas Incorporated)

(Evaluation Conditions for Etching)
(1) Substrate: Silicon substrate chip on which a 1-μm thick copper layer is formed (20 mm×20 mm).
(2) Temperature of polishing liquid: 60° C.±3° C.
(3) Stirring rate: 100 $min^{-1}$
(4) Measurement time 2 min
(5) Amount of polishing liquid: 100 mL (Evaluation Items)
(1) Polishing rate: The polishing rate was calculated from a change of the electrical resistivity in the copper films of which thickness was varied before and after CMP.
(2) Etching rate: To a 100-mL vessel, 100 mL of a metal polishing liquid was charged which was kept at temperature of 60° C. and stirred at rate of 100 $min^{-1}$ and in which the substrate described above for evaluation of etching was immersed for 2 minutes. A difference of the film thickness of copper was evaluated by determining the electrical resistivity of the substrate before and after immersion.

TABLE 1

| | Example | | | | | | | | |
|---|---|---|---|---|---|---|---|---|---|
| | 1 | 2 | 3 | 4 | 5 | 6 | 7 | 8 | 9 |
| Colloidal silica | — | 0.1 | 0.1 | 0.1 | 0.1 | 0.1 | 0.1 | 0.1 | 0.1 |
| Glycine | 1.0 | 1.0 | 1.0 | 1.0 | 1.0 | — | 1.0 | 1.0 | 1.0 |
| α-Alanine | — | — | — | — | — | 1.0 | — | — | — |
| Benzotriazole | 0.02 | 0.02 | — | — | 0.02 | 0.02 | 0.02 | 0.02 | 0.02 |
| 1-hydroxybenzotriazole | — | — | 0.02 | — | — | — | — | — | — |
| 5-methyl-1H-benzotriazole | — | — | — | 0.02 | — | — | — | — | — |
| Polyacrylic acid (Mw 1,000) | — | — | — | — | — | — | — | — | — |
| Polyacrylic acid (Mw 40,000) | 0.05 | 0.05 | 0.05 | 0.05 | — | 0.05 | 0.05 | 0.05 | 0.05 |
| Polyacrylic acid (Mw 500,000) | — | — | — | — | 0.05 | — | — | — | — |
| 30% Hydrogen peroxide | 5.0 | 5.0 | 5.0 | 5.0 | 5.0 | 5.0 | 5.0 | 5.0 | 5.0 |
| (amount of hydrogen peroxide) | (1.5) | (1.5) | (1.5) | (1.5) | (1.5) | (1.5) | (1.5) | (1.5) | (1.5) |
| 25% Aqueous ammonia | — | — | — | — | — | — | 0.005 | 0.010 | 0.020 |
| Protective film-forming agent: polyacrylic acid | 1:2.5 | 1:2.5 | 1:2.5 | 1:2.5 | 1:2.5 | 1:2.5 | 1:2.5 | 1:2.5 | 1:2.5 |
| pH | 4.4 | 4.4 | 4.3 | 4.4 | 4.4 | 4.4 | 5.0 | 5.5 | 6.5 |
| Polishing rate (nm/min) | 480 | 650 | 450 | 900 | 350 | 480 | 510 | 450 | 300 |
| Etching rate at 60° C. (nm/min) | 45 | 50 | 80 | 35 | 60 | 60 | 30 | 20 | 10 |

TABLE 2

| | Comparative Example | | | | | | |
|---|---|---|---|---|---|---|---|
| | 1 | 2 | 3 | 4 | 5 | 6 | 7 |
| Colloidal silica | 0.1 | 0.1 | 0.1 | 0.1 | 0.1 | 0.1 | 0.1 |
| Glycine | 1.0 | 1.0 | 1.0 | 1.0 | 1.0 | 1.0 | — |
| Malic acid | — | — | — | — | — | — | 0.5 |

TABLE 2-continued

|  | Comparative Example | | | | | | |
|---|---|---|---|---|---|---|---|
|  | 1 | 2 | 3 | 4 | 5 | 6 | 7 |
| Benzotriazole | 0.02 | 0.02 | 0.02 | 0.02 | 0.02 | 0.02 | 0.02 |
| 1-hydroxybenzotriazole | — | — | — | — | — | — | — |
| Tolyltriazole | — | — | — | — | — | — | — |
| Polyacrylic acid (Mw 1,000) | — | 0.05 | — | — | — | — | — |
| Polyacrylic acid (Mw 40,000) | — | — | 0.01 | 0.20 | — | — | 0.05 |
| Polyacrylic acid (Mw 500,000) | — | — | — | — | 0.01 | 0.20 | — |
| 30% Hydrogen peroxide | 5.0 | 5.0 | 5.0 | 5.0 | 5.0 | 5.0 | 5.0 |
| (amount of hydrogen peroxide) | (1.5) | (1.5) | (1.5) | (1.5) | (1.5) | (1.5) | (1.5) |
| 25% Aqueous ammonia | — | — | — | — | — | — | — |
| Protective film-forming agent: polyacrylic acid | 1:0 | 1:2.5 | 1:0.5 | 1:10 | 1:0.5 | 1:10 | 1:2.5 |
| pH | 5.8 | 4.4 | 5.2 | 4.1 | 5.2 | 4.1 | 3.2 |
| Polishing rate (nm/min) | 180 | 140 | 240 | 150 | 200 | 280 | 500 |
| Etching rate at 60° C. (nm/min) | 20 | 80 | 150 | 20 | 120 | 20 | 300 |

TABLE 3

|  | Comparative Example | | | |
|---|---|---|---|---|
|  | 9 | 10 | 11 | 12 |
| Colloidal silica | 0.1 | 0.1 | 0.1 | 0.1 |
| Glycine | 1.0 | 1.0 | 1.0 | 1.0 |
| Malic acid | — | — | — | — |
| 1,2,4-Triazole | 0.02 | — | 0.02 | 0.02 |
| 3,5-Dimethylpyrazole | — | 0.02 | — | — |
| Polyacrylic acid (Mw 1,000) | — | — | — | — |
| Polyacrylic acid (Mw 40,000) | 0.05 | 0.05 | 0.12 | 0.01 |
| Polyacrylic acid (Mw 500,000) | — | — | — | — |
| 30% Hydrogen peroxide | 5.0 | 5.0 | 5.0 | 5.0 |
| (amount of hydrogen peroxide) | (1.5) | (1.5) | (1.5) | (1.5) |
| 25% Aqueous ammonia | — | — | — | — |
| Protective film-forming agent:polyacrylic acid | 1:2.5 | 1:2.5 | 1:6 | 1:0.5 |
| pH | 4.4 | 4.5 | 4.1 | 5.2 |
| Polishing rate (nm/min) | 90 | 200 | 220 | 180 |
| Etching rate at 60° C. (nm/min) | 10 | 30 | 30 | 20 |

As indicated in Examples 1-4, when glycine as component A of a metal solubilizer, benzotriazole, 1-hydroxybenzotriazole, and 5-methyl-1H-benzotriazole as component B of a protective film-forming agent, and an acrylic acid polymer having the weight average molecular weight of 40,000 as component C of an additive are used, good polishing rates and practically useful etching rates are obtained. The mass ratio between component B and component C is 1:2.5 in every case (the mass ratio between the protective film-forming agent and polyacrylic acid is 1:2.5, in which the protective film-forming agent corresponds to component B and polyacrylic acid corresponds to component C). When polyacrylic acid has the weight average molecular weight of 500,000 as indicated in Example 5, a good polishing rate is similarly obtained. When alanine is used as component A of the metal solubilizer, as indicated in Example 6, a good polishing rate is obtained. Further when pH is raised as indicated in Examples 7-9, low etching rates can be obtained while keeping good polishing rates.

On the other hand, when acrylic acid polymers are not added as indicated in Comparative Example 1, a polishing rate tends to be lower as compared to Examples.

As indicated in Comparative Example 2, when the weight average molecular weight of acrylic acid polymers is low at 1,000 (when polyacrylic acid does not correspond to component C while the mass ratio between the protective film-forming agent and polyacrylic acid is 1:2.5), a polishing rate tends to be lower as compared to Examples. As indicated in Comparative Examples 3-6, when the mass ratio between component B and component C is outside the range of 1:1 to 1:5, polishing rates and etching rates tend to be lower as compared to Examples. In addition, as indicated in Comparative Example 7, when malic acid is used as a metal solubilizer instead of component A indicated, an etching rate tends to be lower as compared to Examples. Further as indicated in Comparative Examples 9-12, when a protective film-forming agent not having the benzotriazole skeleton is used (when the protective film-forming agent does not correspond to component B), polishing rates tend to be lower as compared to Examples.

INDUSTRIAL APPLICABILITY

Use of a metal polishing liquid of the present invention and a polishing method using the same can simultaneously yield both high polishing rates and low etching rates at higher level against metal (in particular, copper type metal) forming an embedded pattern with higher reliability.

EXPLANATION OF REFERENCE NUMERALS

10 Interlayer insulating film
11 Trench portion (convex part)
12 Raised portion (concave part)
13 Step difference portion
14 Face of which the step difference portion is formed
20 Barrier layer
30 Metal layer
100, 200 Substrate

The invention claimed is:
1. A metal polishing liquid for polishing at least a part of metal in a substrate having the metal, comprising
component A: a metal solubilizer containing an amino acid, wherein the metal solubilizer includes at least one of glycine or α-alanine;
component B: a compound having the benzotriazole skeleton selected from the group consisting of benzotriazole, 1-hydroxybenzotriazole or 5-methyl-1H-benzotriazole;
component C: an acrylic acid polymer comprising polyacrylic acid having the weight average molecular weight of 20,000 or more,
an oxidizing agent containing hydrogen peroxide; and
abrasive grains, wherein the mass ratio between the component B and the component C, (component B:component C), is 1:1 to 1:5.

2. The metal polishing liquid according to claim 1, wherein pH is in the range of 2 to 6.

3. A metal polishing liquid according to claim 1, wherein the metal contains at least one type selected from the group consisting of copper, copper alloys, copper oxides, and oxides of copper alloys.

4. A metal polishing liquid according to claim 1, wherein a mole ratio of the amino acid in the metal solubilizer is at least 90%.

5. The metal polishing liquid according to claim 1, wherein the amino acid has a molecular weight of 200 or less.

6. The metal polishing liquid according to claim 1, wherein the amino acid has a molecular weight of 150 or less.

7. The metal polishing liquid according to claim 1, wherein the metal solubilizer comprises primary amino acids.

8. The metal polishing liquid according to claim 1, wherein the metal solubilizer comprises primary amino acids having a molecular weight of 200 or less.

9. The metal polishing liquid according to claim 1, wherein the metal solubilizer comprises primary amino acids having a molecular weight of 150 or less.

10. The metal polishing liquid according to claim 1, wherein the metal solubilizer includes glycine, α-alanine, β-alanine (3-aminopropanoic acid), or 4-aminobutyric acid.

11. A polishing method comprising polishing a part of metal in a substrate having the metal, wherein the polishing is performed by using the metal polishing liquid according to claim 1.

12. A metal polishing liquid for polishing at least a part of metal in a substrate having the metal, comprising
   component A: a metal solubilizer comprising more than 99 mol % of amino acid, wherein the metal solubilizer includes at least one of glycine or α-alanine;
   component B: a compound having the benzotriazole skeleton selected from the group consisting of benzotriazole, 1-hydroxybenzotriazole or 5-methyl-1H-benzotriazole;
   component C: an acrylic acid polymer comprising polyacrylic acid having the weight average molecular weight of 20,000 or more,
   an oxidizing agent containing hydrogen peroxide; and
   abrasive grains,
   wherein the mass ratio between the component B and the component C, (component B:component C), is 1:1 to 1:5.

13. The metal polishing liquid according to claim 12, wherein the amino acid has a molecular weight of 200 or less.

14. The metal polishing liquid according to claim 12, wherein the amino acid has a molecular weight of 150 or less.

15. The metal polishing liquid according to claim 12, wherein the metal solubilizer comprises primary amino acids.

16. The metal polishing liquid according to claim 12, wherein the metal solubilizer comprises primary amino acids having a molecular weight of 200 or less.

17. The metal polishing liquid according to claim 12, wherein the metal solubilizer includes glycine, α-alanine, β-alanine (3-aminopropanoic acid), or 4-aminobutyric acid.

18. A metal polishing liquid for polishing at least a part of metal in a substrate having the metal, comprising
   component A: a metal solubilizer comprising an amino acid and lacking an inorganic acid, wherein the metal solubilizer includes at least one of glycine or α-alanine;
   component B: a compound having the benzotriazole skeleton selected from the group consisting of benzotriazole, 1-hydroxybenzotriazole or 5-methyl-1H-benzotriazole;
   component C: an acrylic acid polymer comprising polyacrylic acid having the weight average molecular weight of 20,000 or more,
   an oxidizing agent containing hydrogen peroxide; and
   abrasive grains,
   wherein the mass ratio between the component B and the component C, (component B:component C), is 1:1 to 1:5.

* * * * *